(12) United States Patent
Buynoski et al.

(10) Patent No.: US 6,852,586 B1
(45) Date of Patent: Feb. 8, 2005

(54) SELF ASSEMBLY OF CONDUCTING POLYMER FOR FORMATION OF POLYMER MEMORY CELL

(75) Inventors: Matthew S. Buynoski, Palo Alto, CA (US); Suzette K. Pangrle, Cupertino, CA (US); Uzodinma Okoroanyanwu, Mountain View, CA (US); Nicholas H. Tripsas, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/677,042

(22) Filed: Oct. 1, 2003

(51) Int. Cl.$^7$ .......................................... H01L 21/8234
(52) U.S. Cl. ........................ 438/238; 438/253; 438/381
(58) Field of Search .......................... 438/3, 238–256, 438/381–398

(56) References Cited

U.S. PATENT DOCUMENTS 6,570,204 B1 * 5/2003 Agarwal ..................... 257/296

* cited by examiner

Primary Examiner—H. Jey Tsai
(74) Attorney, Agent, or Firm—Amin & Turocy, LLP

(57) ABSTRACT

The present invention provides a selectively conductive organic semiconductor (e.g., polymer) device that can be utilized as a memory cell. A polymer solution including a conducting polymer self assembles relative to a conductive electrode. The process affords self-assembly such that a shortest conductive path can be achieved. The method includes depositing a concentrated solution of conducting polymer on a conductive surface, applying heat and optionally a vacuum, and permitting the conducting polymer to self-assemble into an organic semiconductor. The organic semiconductor can be employed within single and multi-cell memory devices by forming a structure with two or more electrodes while employing the organic semiconductor along with a passive device between the electrodes. A partitioning component can be integrated with the memory device to facilitate programming and stacking of additional memory cells on top of or in association with previously formed cells.

8 Claims, 14 Drawing Sheets

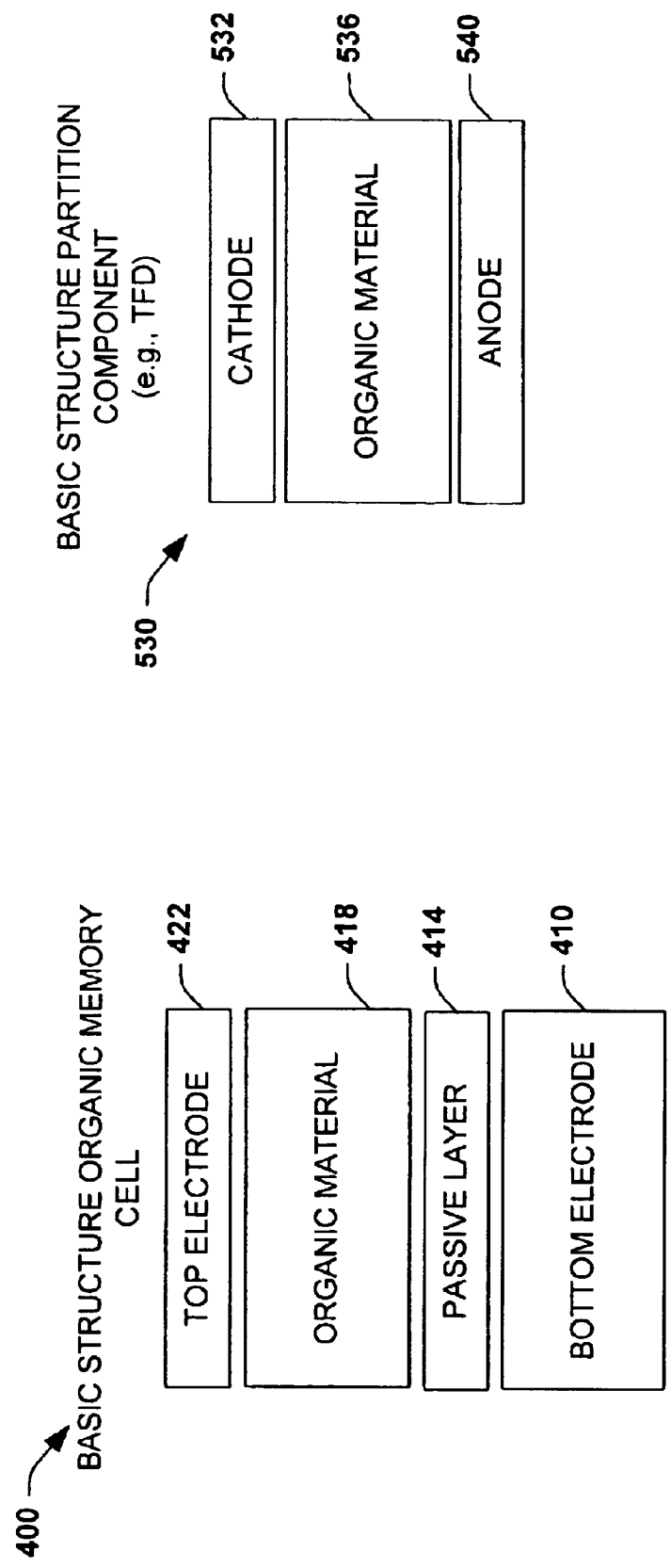

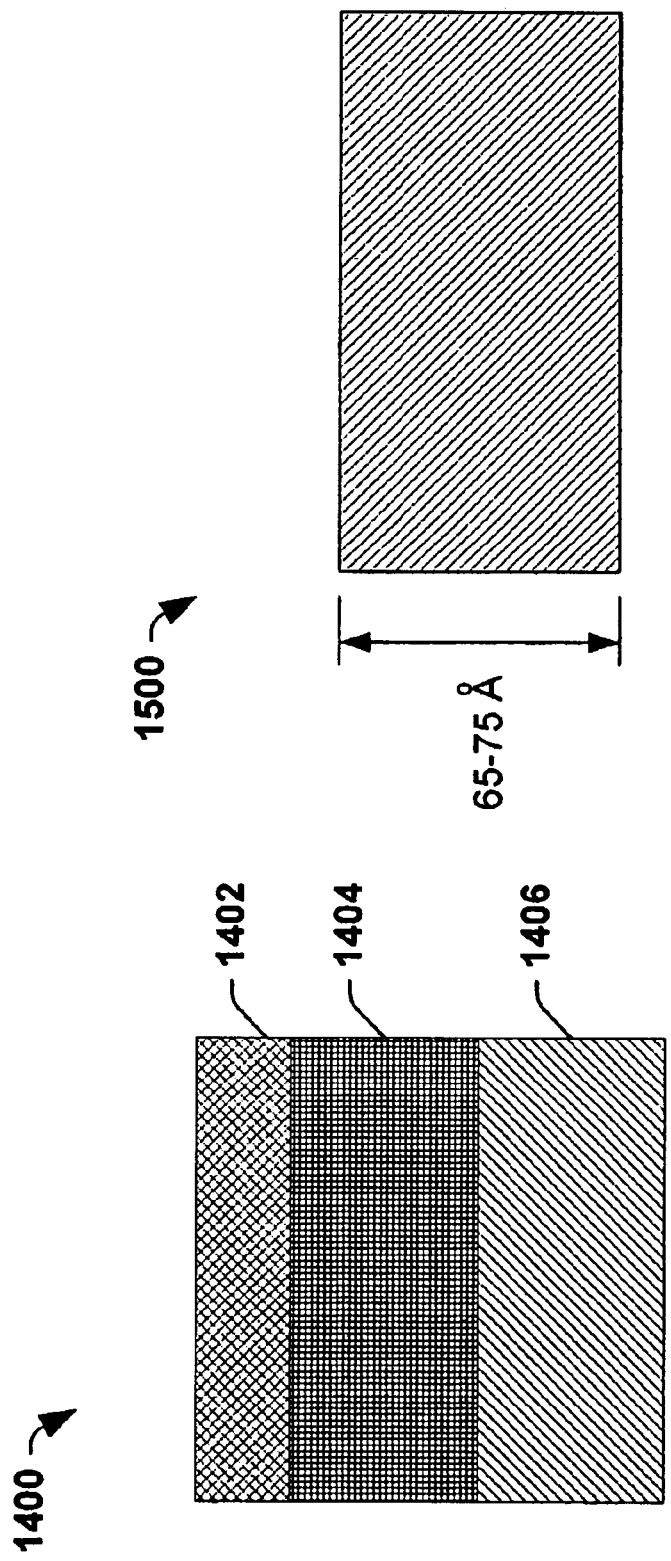

SELF ASSEMBLY OF CONDUCTING POLYMER FOR FORMATION OF POLYMER MEMORY CELL

FIELD OF INVENTION

The present invention relates generally to organic memory devices and, in particular, to organic memory devices containing a self-assembling organic semiconductor.

BACKGROUND OF THE INVENTION

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Memory devices generally include arrays of memory cells. Each memory cell can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid-state technology, such as, crystalline silicon devices. A common semiconductor device employed in memory devices is the metal oxide semiconductor field effect transistor (MOSFET).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Inorganic solid-state devices are generally encumbered with a complex architecture, which leads to high cost and a loss of data storage density. The volatile semiconductor memories based on inorganic semiconductor material must constantly be supplied with electric current with a resulting heating and high electric power consumption in order to maintain stored information. Non-volatile semiconductor devices have a reduced data rate and relatively high power consumption and large degree of complexity.

Moreover, as the size of inorganic solid-state devices decreases and integration increases, sensitivity to alignment tolerances increases making fabrication markedly more difficult. Formation of features at small minimum sizes does not imply that the minimum size can be used for fabrication of working circuits. It is necessary to have alignment tolerances, which are much smaller than the small minimum size, for example, one quarter the minimum size.

Scaling inorganic solid-state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely. Furthermore, applying a voltage across a semiconductor junction (in the reverse-bias direction) creates a depletion region around the junction. The width of the depletion region depends on the doping levels of the semiconductor. If the depletion region spreads to contact another depletion region, punch-through or uncontrolled current flow, may occur.

Higher doping levels tend to minimize the separations required to prevent punch-through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversibly degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge. Thus, further device shrinking and density increasing may be limited for inorganic memory devices. Furthermore, such device shrinkage For inorganic non-volatile memory devices while meeting increased performance demands is particularly difficult, especially while maintaining low costs.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention relates to systems and methods for fabricating organic memory devices with a semiconductor material formed with a polymer solution comprising a self-assembling conducting polymer. Organic memory devices are provided that can store information within the organic semiconductor material associated with the device. Such memory devices include two electrodes sandwiching the organic semiconductor material and a passive layer, wherein the organic semiconductor can be positioned adjacent to the passive layer.

The organic memory devices can be formed by depositing a concentrated polymer solution comprising a conductive polymer and an organic solvent within an opening over a conductive electrode and/or over a passive layer applied to the conductive electrode. The conducting polymer orients such that a polar group at one end aligns itself proximate with the conductive electrode and/or passive layer on the conductive electrode and a non-polar chain extends away from the conductive electrode. Heat can then be applied to evaporate the organic solvent from the polymer solution, encouraging the conductive polymer to self-assemble with the shortest conductive path. Additionally, the organic memory device could be placed in a vacuum while the conductive polymer self-assembles to provide a controlled environment where organic solvent can be removed.

A partitioning component can be integrated with an organic memory structures to facilitate programming and/or form a voltage/current-controlled isolation barrier. Partitioning devices include such devices as thin film diodes or thin film transistors. and other components that can be employed to form a voltage/current-controlled barrier. A memory cell can be activated by applying threshold voltages to the partitioning component (e.g., forward diode voltage, reverse Zener breakdown voltage). and applying voltages to underlying passive and conductive layers within the stacked memory structure, wherein bits can be stored in the form of a 0.1 or other states within the selected portions or the memory structure.

The organic memory structures can be formed in a vertical arrangement. Wherein the aforementioned partitioning component is formed or constructed between two or more organic memory structures to facilitate stacking of a plurality of similarly configured memory structures or cells. In addition, a plurality of vertically arranged stacks can be formed in parallel thus facilitating construction of high-density memory devices, having multiple layers of vertically arranged memory cells, and providing high-speed parallel access to the respective cells. In this manner, memory device utilization, density, and packing can be substantially improved.

The memory structures and associated memory cells can be employed to provide multi-cell organic memory devices that utilize an organic conductor that facilitates migration of charge (e.g., electrons, holes). The present invention provides organic memory devices that possess at least one or more of the following: small size compared to inorganic memory devices, capability to store multiple bits of information, short resistance/impedance switch time, low operating voltages, low cost, high reliability, long life (thousands/millions of cycles), capable of three dimensional packing, associated low temperature processing, light weight, high density/integration, and extended memory retention.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 4 is a diagram illustrating basic organic memory layers in accordance with an aspect of the present invention.

FIG. 5 is a diagram illustrating basic partitioning component layers in accordance with an aspect of the present invention.

FIG. 14 is a block diagram of a passive layer that can be employed in an organic memory device in accordance with an aspect of the present invention.

FIG. 15 is a block diagram illustrating an organic polymer layer formed by a CVD process in accordance with an aspect of the present invention.

DETAILED DESCRIPTION OF THE INVENTION

Figure 1:
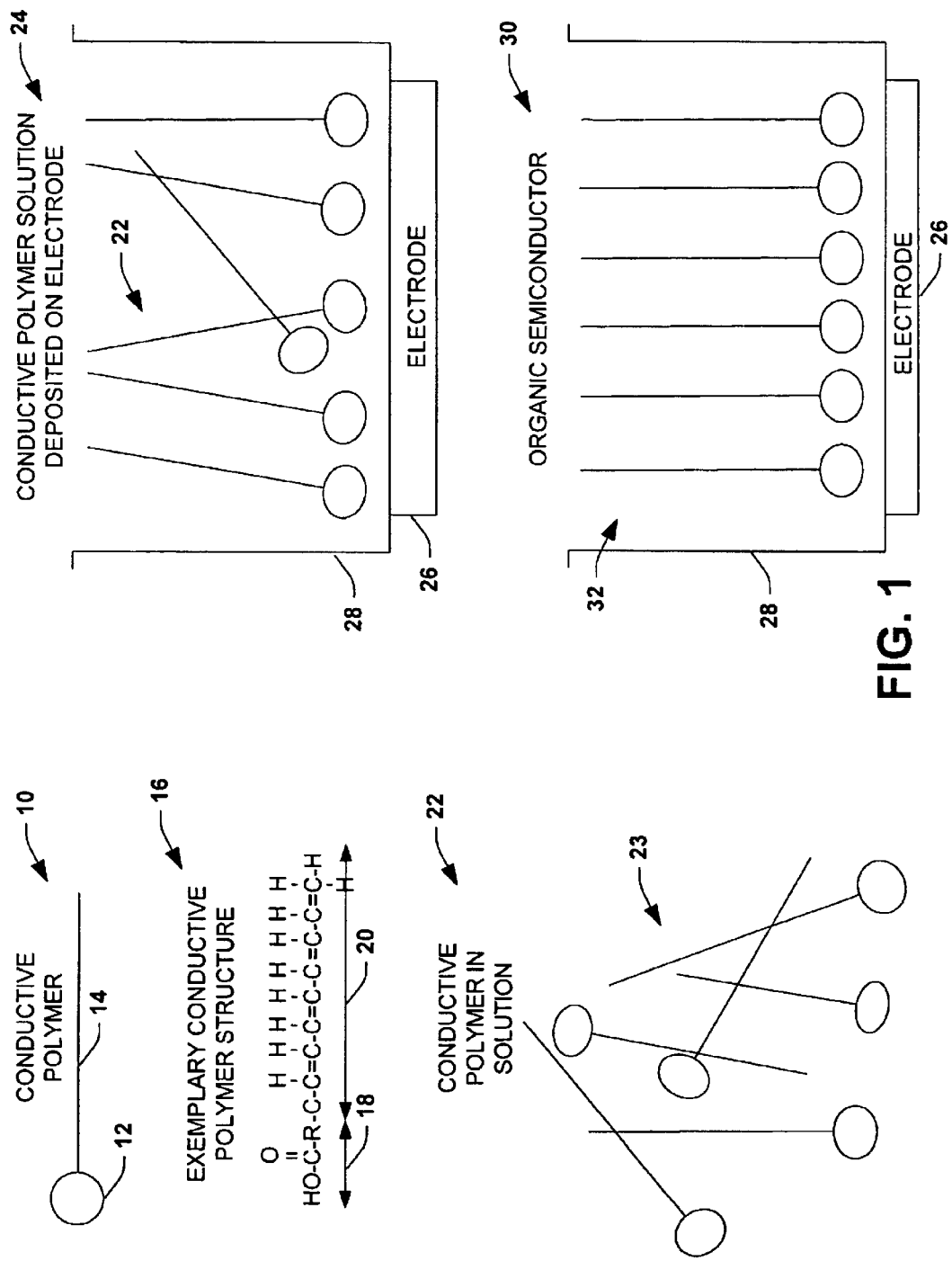
FIG. 1 illustrates a conductive polymer employed to form an organic semiconductor in accordance with an aspect of the present invention.

The present invention provides an organic memory device that can operate as a non-volatile memory. The organic memory device can be formed with two or more electrodes with a passive layer associated with at least one electrode and an organic semiconductor layer formed between the electrodes and the associated passive layer, wherein the organic semiconductor layer if formed from a solution of a conductive polymer preferably with a conjugated non-polar chain to provide rigidity and conductivity and an organic solvent. An exemplary conductive polymer is illustrated at reference numeral 10 of FIG. 1. The polymer chain includes a reactive site (or end) 12 and a non-polar chain 14. Examples of reactive sites or reactive ends include polar groups, radicals, and ionic groups. The reactive end 12 may comprise hydrogen and oxygen, sulfur and/or nitrogen, and includes groups comprising of at least of an alcohol group, an acid group, a sulfonic acid group, an ester group, ion/counterion, and/or a group with a conjugated bond. The non-polar chain 14 is largely carbon and hydrogen. At 16 an exemplary conductive polymer with an alcohol reactive end 18 and non-polar end 20 is illustrated.

Proceeding to reference numeral 22, a portion of the polymer solution is illustrated, depicting the conductive polymers 23 randomly oriented. At reference numeral 24, the portion of polymer solution is deposited over an electrode 26 and within an opening 28. The conductive polymers 22 align such that the reactive end 12 orients with the electrode 26 (or passive layer), and the non-polar chain 14 orients in a substantially perpendicular manner and lamellar arrangement away from the electrode 26.

Heat can be applied to facilitate evaporation of the solvent such that the concentration of the conductive polymers 22 in the solution is present at a suitable concentration to facilitate self-assembly. At reference numeral 30, an organic semiconductor 32 is formed within the opening 28 and over the electrode 30.

Figure 2:
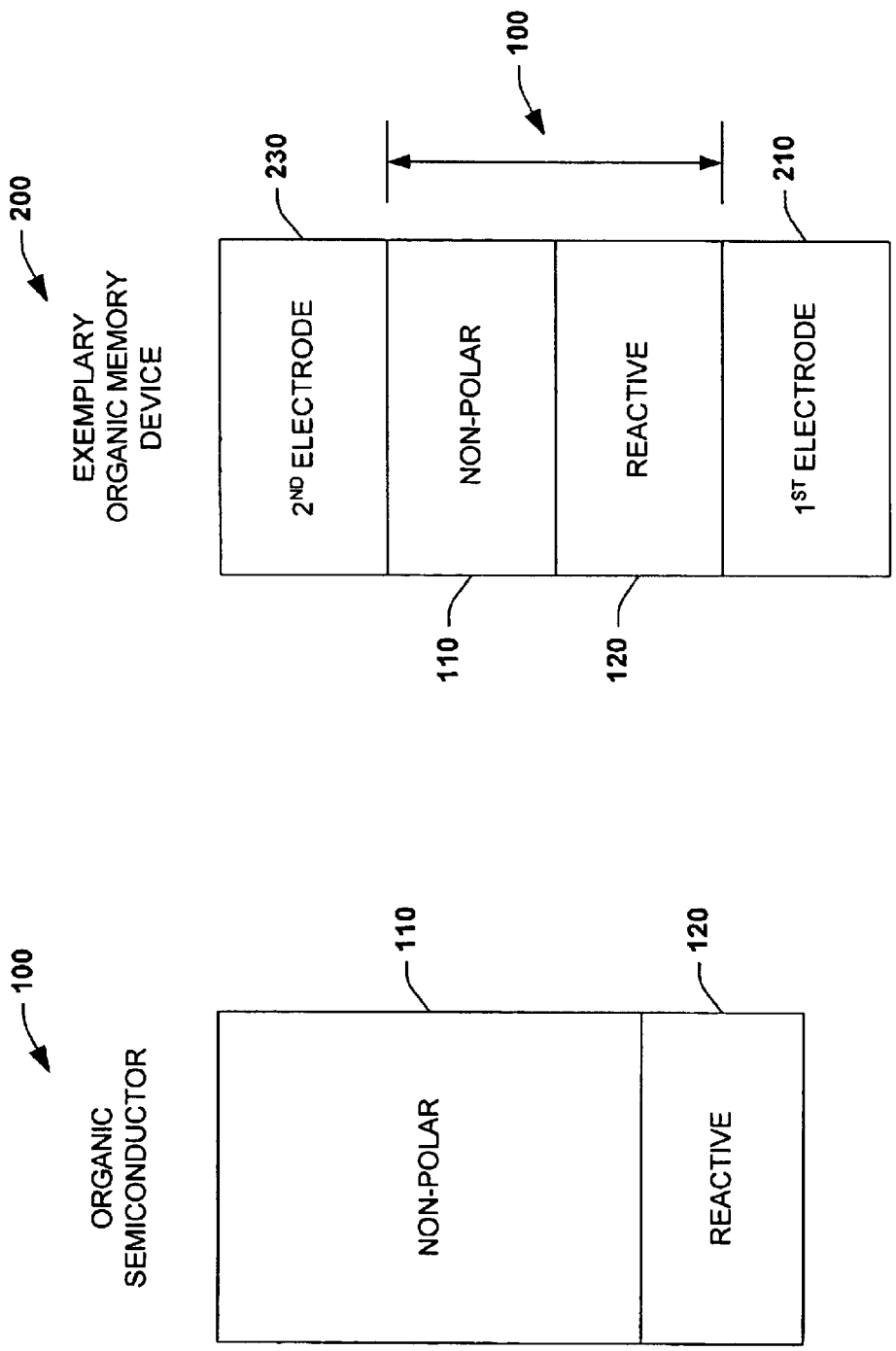
FIG. 2 illustrates an organic semiconductor and exemplary organic memory device in accordance with an aspect of the present invention.

Referring now to FIG. 2, an organic semiconductor 100 is illustrated in accordance with an aspect of the present invention. The organic semiconductor 100 comprises a non-polar chain 110 and a reactive end 120. The orientation (e.g., top and bottom) of the non-polar end 110 relative to the reactive end 120 is not limited as presented. It is to be appreciated that the structure depicted can exist as the reactive end 120 on the top and the non-polar end on the bottom (e.g., 180 degree rotation) and in other orientations. Various factors exist that determine the orientation of the non polar 110 end relative to the reactive end 120 as will be described in detail below.

It is noted that although the organic semiconductor 100 is illustrated as segmented into two regions—the non-polar chain 10 and the reactive end 120—it is to be appreciated that the non-polar chain 110 may have polar constituents and that the reactive end 130 may have non-polar (e.g., electrically neutral) constituents. Furthermore, such interleaving of the non-polar chain and the reactive end of the polymer of tile organic semiconductor 100 can be desired. Moreover, both the non-polar chain 110 and the reactive end 120 of the organic semiconductor 100 may contain other elements, chains or the like, for example to alter properties such as conductivity and heat dissipation and alignment of side groups.

As previously stated, an organic memory device can be formed with two or more electrodes having a conductive medium between the electrodes forming a memory cell. The conductive medium can include a conductive polymer that orients and self-assembles to form an organic semiconductor. FIG. 2 further illustrates an example of a memory device in accordance with an aspect of the present invention. An organic memory device 200 includes a first electrode 210 that is operatively coupled to an organic semiconductor 100. The organic semiconductor 100 can be a selectively conductive intermediate between the first electrode 210 and a second electrode 230. Typically, the first electrode 210 and/or tile second electrode 230 will include a passive material (not shown) deposited on the surface of first electrode 210 and/or the second electrode 130 that contacts the organic semiconductor 100. Applying an electrical potential across the first electrode 210 and the second electrode 230 elicits a current to flow from the first electrode 210, through the organic semiconductor 100 to the second electrode 230.

Indicated supra, a reactive end 120 and a non-polar chain 110 of the organic semiconductor 100 orient, respectively, during formation of the organic semiconductor 100 according to the conductive surface to which the organic semiconductor 100 is applied. For example, if the polymer solution (not shown) is applied to the surface of the first electrode 210 during the formation of the organic semiconductor 100, then generally the reactive end 120 will orient towards the conductive surface of the first electrode 210 and the non-polar chain 110 will orient away from the first electrode 210 surface.

It is to be appreciated that the formation of the organic semiconductor 100 can be formed on the surface of the second electrode 230 rather than the first electrode 210. That is, the reactive end 120 can orient towards the conductive surface of the second electrode 230 and the non-polar chain 110 can orient away from the second electrode 230 surface.

Figure 3:
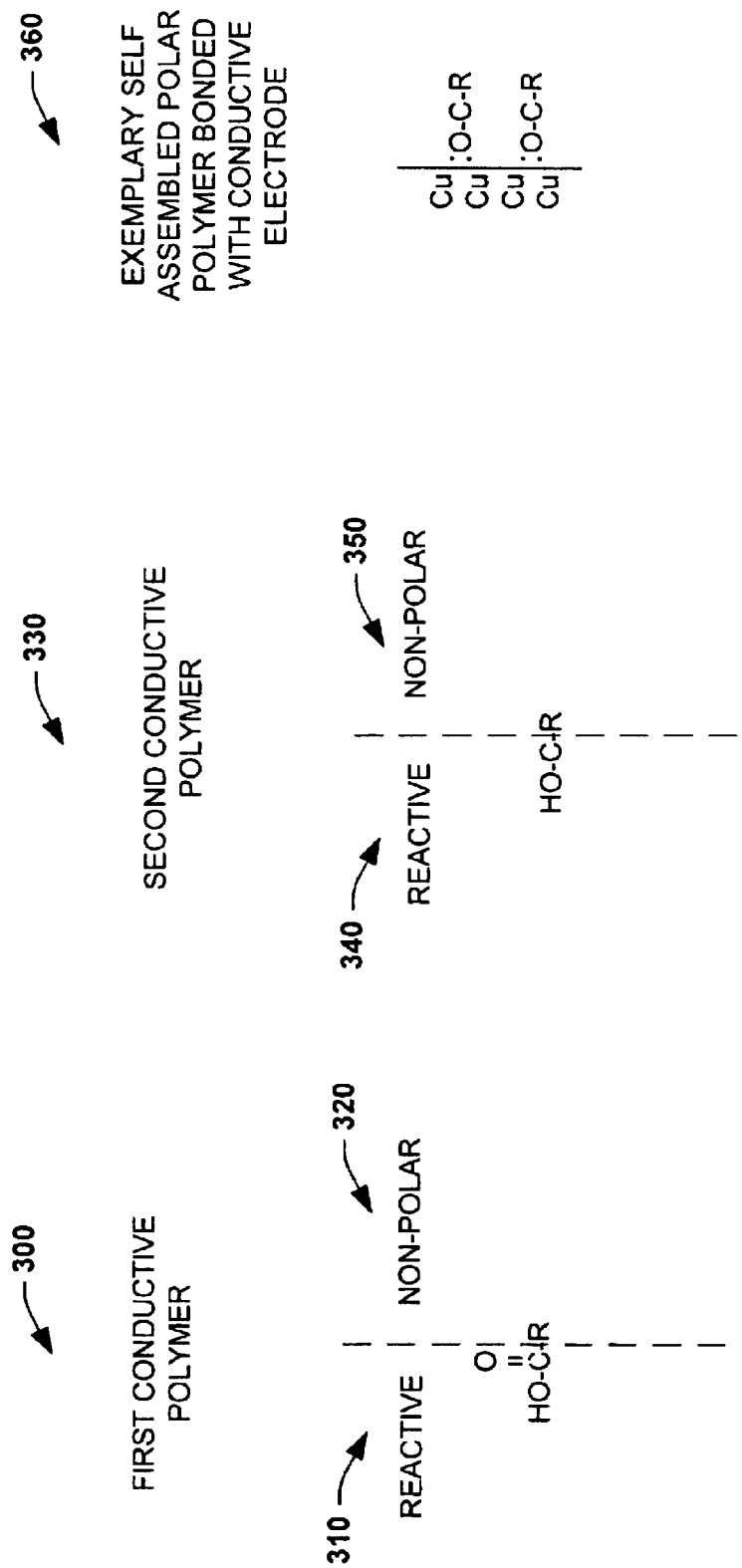
FIG. 3 illustrates exemplary polar polymer chains and polar polymer in accordance with an aspect of the present invention.

Exemplary organic conductive polymers and an exemplary conductive polymer bond are illustrated in FIG. 3 in accordance with an aspect of the invention. An organic conductive polymer 300 includes a reactive end 310 and a non-polar chain (R) 320, wherein R is an organic moiety. The organic conductive polymer 330 includes a reactive end 340 and a non-polar chain 350 (R), again R is an organic moiety. R preferably is a conjugated (e.g., single and double bonds between carbons) organic moiety, providing rigidity and conductivity. Organic conductive polymer 300 and/or organic conductive polymer 330 can be employed in an aspect of the present invention. However, the invention is not limited by the examples and can utilize other organic conductive polymer chains.

Generally, a polymer solution is procured wherein the concentration of conductive polymer is present at a suitable concentration that facilitates deposition of the solution, and then self-assembly on an electrode. Examples of organic conductive polymers include the conductive polymers 300 and 330. The polymer solution can then be deposited on a substrate wherein the polymer solution fills the channels of a damascene structure. The reactive end of the conductive polymer is then attracted to a conductive electrode surface and orients accordingly. Bonds will form between the reactive end and the conductive electrode. For example, at 360 a typical bond between a conductive polymer such as 300 or 330 and a copper (Cu) electrode is illustrated, wherein R is typically a conjugated organic moiety and n is an integer from zero to about one million. As the solvent is removed from the polymer solution, the conductive polymer self assembles.

Proceeding to FIG. 4, a basic organic memory structures is illustrated in accordance with an aspect of the present invention. An organic memory cell 400 typically includes several layered portions. Such portions include a bottom electrode 410, an organic material 414 for storing information, a passive layer 418 to facilitate access to the organic semiconductor material 414, and a top electrode 422 that operates in accordance with the bottom electrode 410 to program, erase, and/or access the organic semiconductor material 414. The organic memory cell 400 which can be constructed from various materials is described in more detail below.

FIG. 5 illustrates an organic partitioning component (e.g., a thin film diode. TFD) that can be employed with memory cells such as the organic memory cell 400. In one embodiment, an organic partitioning component is employed to facilitate programming and/or access in one direction by being biased in a forward direction. In a reverse direction, a breakdown bias voltage can be applied to facilitate programming/access to the organic memory device in the opposite direction.

An organic partitioning component can also be illustrated to include several layered portions. As illustrated, the TFD 530 includes a cathode electrode 532, an organic material 536 (e.g., polymer film), and an anode electrode 540. Thus applying a forward or positive bias voltage on the anode electrode 540 with respect to the cathode electrode 532 causes current to flow in a forward direction. In a reverse direction of the bias voltage, current flow is typically minimized. unless the reverse bias voltage is increased beyond the reverse breakdown threshold of the TFD 530. Thus, by controlling the forward and reverse voltages applied to the TFD 530, programming and access can be provided to the associated organic memory structure, while in yet another regard, the TFD 530 provides isolation/separation.

As can be appreciated, respective partitioning components can be formed in accordance with various materials and/or processes, wherein various threshold voltages can be utilized to cause the partitioning components to conduct in the forward and reverse directions (e.g. 0.7 v forward threshold, −3.2 v reverse threshold, suitable voltage applied to control element of a three-terminal switching device).

It is to be appreciated that although various exemplary layers are illustrated in the organic memory structure 400 and TFD 530, that other layers may be formed and/or provided in accordance with the present invention. For example, such layers can include Inter Layer Dielectrics (ILD), barrier layers, coatings, and/or combinations of layers/other elements that cooperate to form memory structures and/or partitioning components in accordance with the present invention which includes alternative layers and/or elements that are described in more detail below.

FIGS. 6 through 9 illustrate devices and associated methodologies to facilitate single cell and multi-cell memory fabrication in accordance with the present invention. While, for purposes of simplicity of explanation, the methodologies may be shown and described as a series of acts, it is to be understood and appreciated that the present invention is not limited by the order of acts, as some acts may, in accordance with the present invention, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the present invention.

Figure 6:
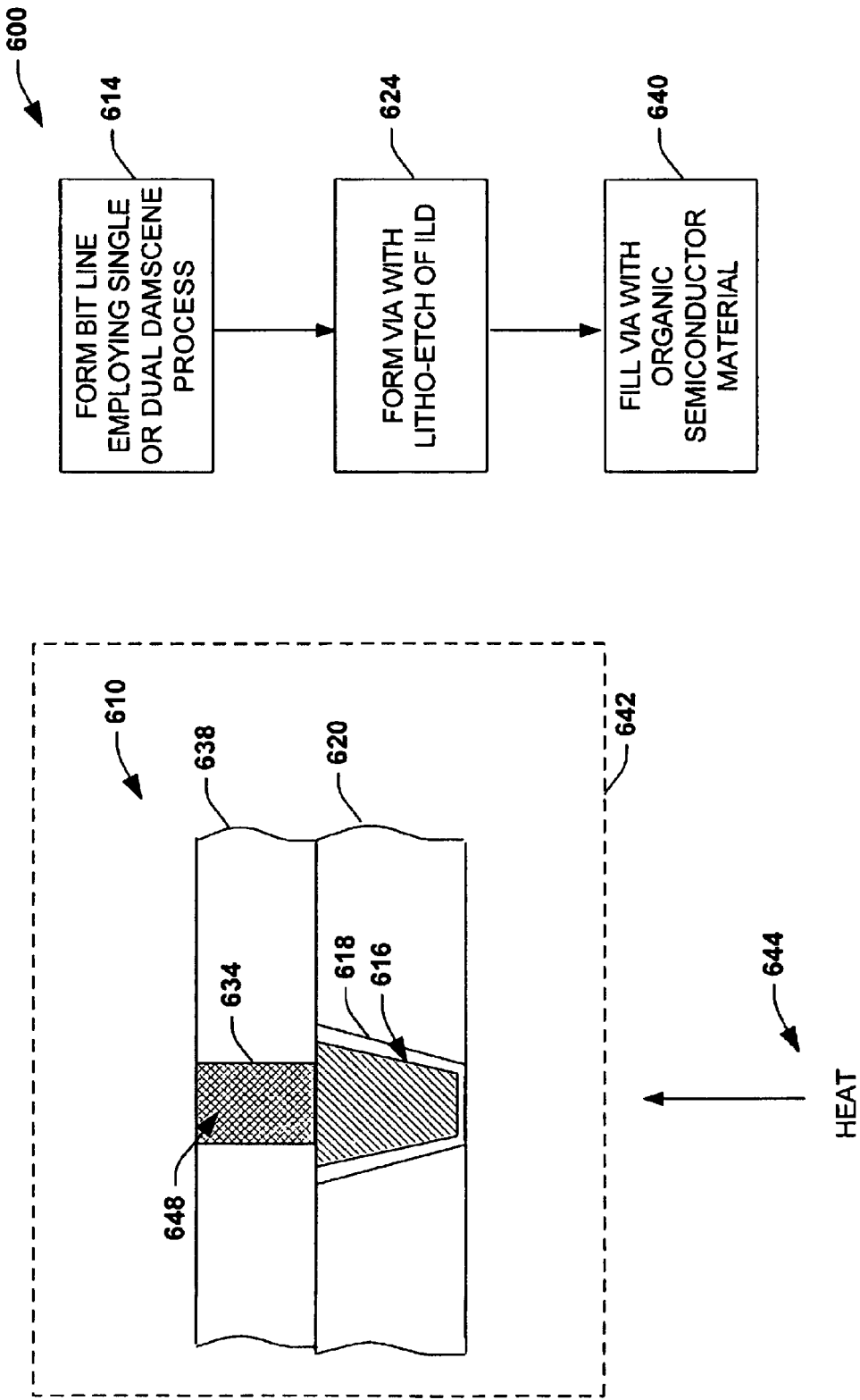
FIG. 6 is a flow diagram and associated structure illustrating a portion of a process for fabricating a polar polymer memory device in accordance with an aspect of the present invention.

Referring now to FIG. 6, a diagram 600 illustrates a portion of a process for fabricating a memory device 610 with conductive polymers in accordance with the present invention. Before proceeding with a description of the process 600 and associated structure 610, it is noted that exemplary materials and process steps will be described. However, it is to be appreciated that the present invention is not so limited. Thus, a plurality of alternative materials and/or compounds will be described in more detail below that can be employed in accordance with the present invention.

Proceeding to 614, a copper bit line, word line or lower electrode having an associated barrier is formed in accordance with a single or dual damascene process as is well understood. The lower electrode (or word line or bit line) is illustrated at 616 of structure 610, within a barrier 618. Both are formed in an ILD layer 620. The barrier 618 is employed to mitigate copper or other conductive material from diffusing into other layers (not shown). As an example, the barrier 618 can be formed as a diffusion barrier. Such barrier materials that can be utilized are cobalt. chromium, nickel, palladium, tantalum, tantalum silicon nitride, titanium, titanium nitride, silicon nitride, tungsten nitride, and tungsten silicon nitride, for example.

At 624, a via or other type opening 634 is formed in an ILD layer 638, above the lower electrode 616. The via 634 can be formed in accordance with a lithographic etch technique, for example, and/or other process for removing portions of the ILD layer 638. At 640, all or portions of the via 634 is filled with an organic material deposition, wherein a solution of organic conductive polymer (e.g., the polymer chains 300 and 330) and organic solvent is deposited.

Once in the via 634, the reactive end of the conductive polymer is attracted to the lower electrode 616. As the reactive end positions itself near the lower electrode 616, the non-polar end is positioned away from the lower electrode 616. For example, where the underlying bit line is substantially copper, a bond will form between the reactive end, for example HO—C—(from HOC—R), such that Cu—O—C—R is formed between the Cu bit line and the HO—C—R polar polymer.

Self-assembly of the conductive polymer can begin to occur as the polymer solution is being deposited. As illustrated, the memory device 610 is typically placed in a vacuum chamber 642 wherein solvent can be removed in a controlled environment. In addition, a heat 644 can be applied to evaporate solvent from the polymer solution. The heat 644 is illustrated directed towards bottom layer. It can be appreciated that heat can be applied uniformly around the entire system 610. for example in an oven. Furthermore, heat can be applied non-uniformly, symmetrical. non-symmetrical and/or in any various method that is in accordance with the invention. As the solvent of the polymer solution evaporates, the conductive polymer concentration in the polymer solution increases, expediting self-assembly. Upon completion of self-assembly, the organic semiconductor 648 is formed.

Figure 7:
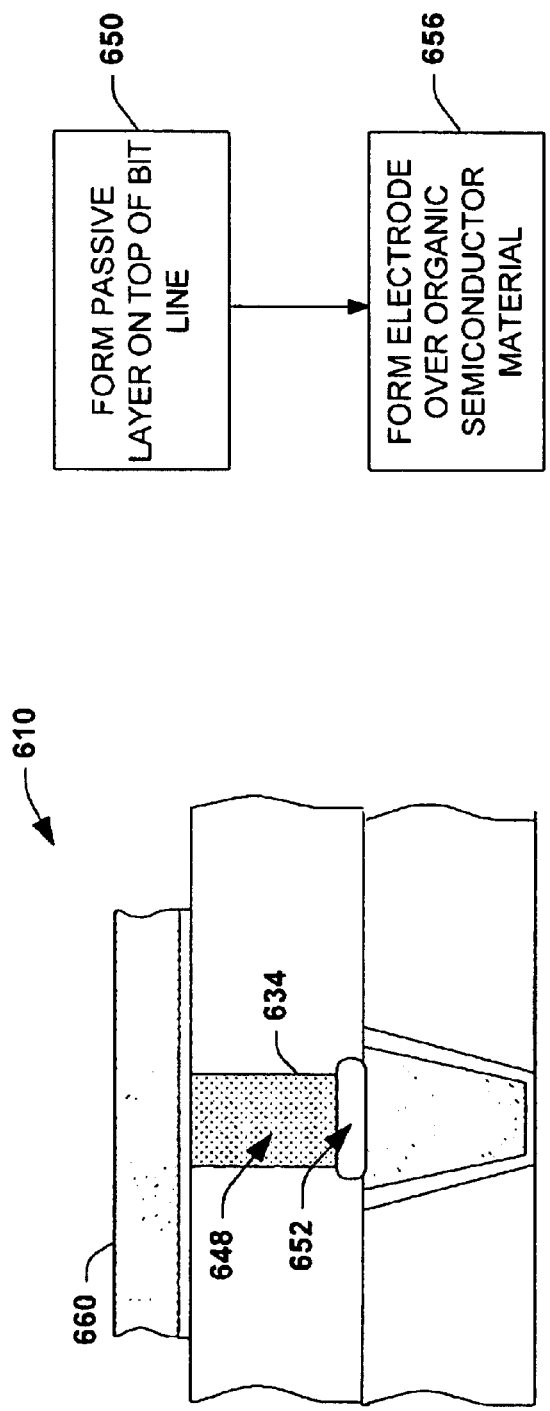
FIG. 7 is a flow diagram and associated structure illustrating a continuation of the process depicted in FIG. 6 for a polar polymer memory structure in accordance with an aspect of the present invention.

FIG. 7 illustrates a continuation of the process depicted in FIG. 6 in accordance with an aspect of the present invention. At 650, a passive layer such as $Cu_{2-x}S$, for example, can be formed under the organic semiconductor 648. The passive layer is illustrated at 652 of the structure 610. At 656, an electrode 660 having an associated barrier are formed over the passive layer 652 in accordance with a single or dual damascene process.

Figure 8:
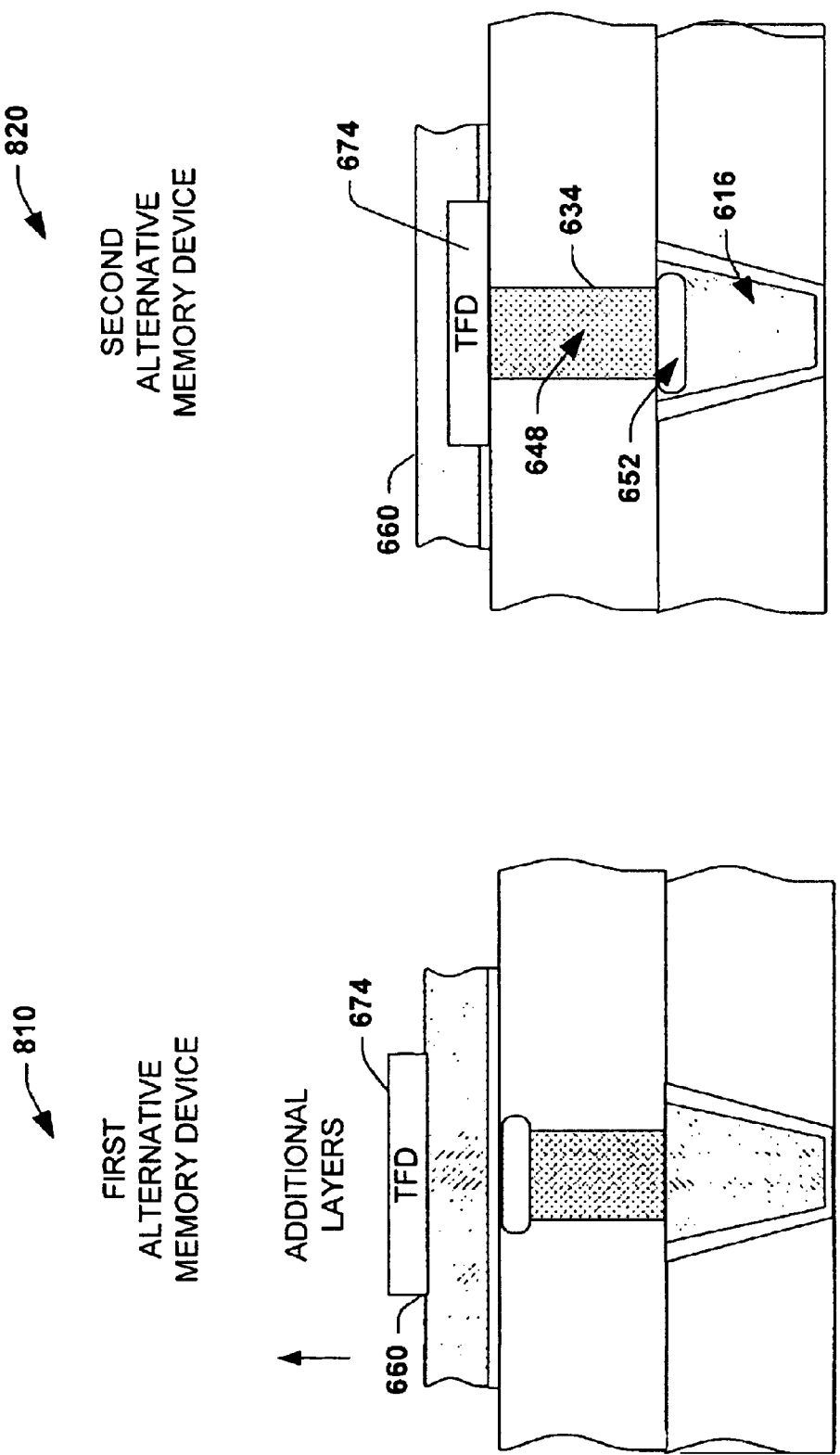
FIG. 8 is a flow diagram and associated structure illustrating a continuation of the process depicted in FIG. 7 for a polar polymer memory structure in accordance with an aspect of the present invention.

FIG. 8 illustrates alternative architectures for the memory device structure 610 in accordance with an aspect of the present invention. A first alternative memory device 810 continues the process 600, wherein a TFD 674 is formed over the top electrode 660. As previously noted, a TFD such as TFD 674 can be employed to facilitate programming and/or stacking of memory devices. If desired, additional layers can be deposed. For example, a hard mask, a resist and an antireflective coating may be employed.

In a second alternative memory device 820, the passive layer 652 is formed over the bit line 616 before the organic semiconductor 648 is formed. Subsequently, the organic semiconductor 648 is deposited as described above. That is, a solution of conductive polymers is deposited, wherein heat is applied to evaporate the solvent form the solution which facilitates self-assembly of the conductive polymer. Then, TFD 674 is integrated over the organic semiconductor 648, and the top electrode 660 is formed over the organic semiconductor 648. It is to be appreciated that the above examples do limit the scope of the invention, but provide various configurations with which memory cells can be constructed employing self-assembling polar polymer. Any known configuration, including additional structures or fewer structures, can be employed.

Figure 9:
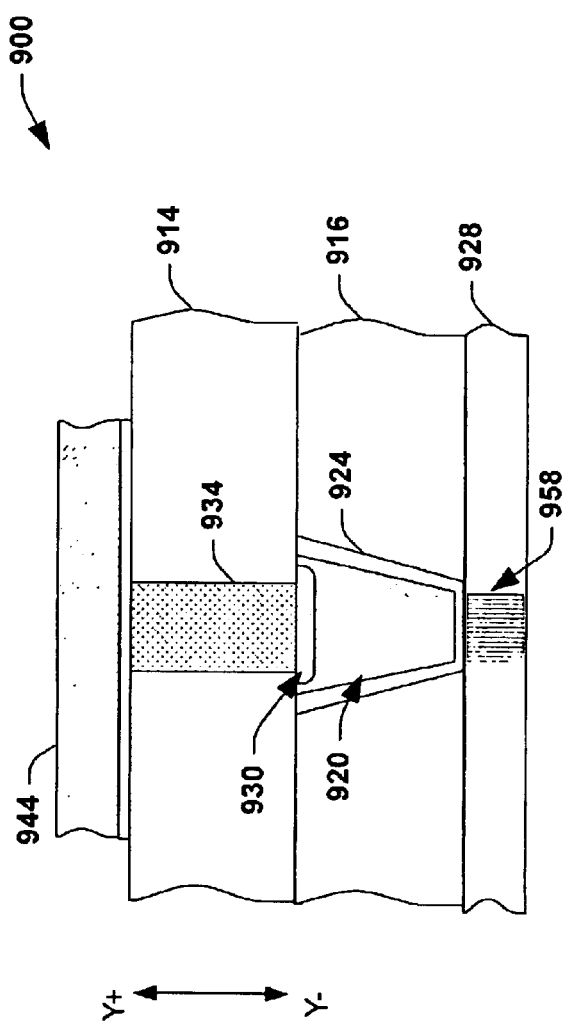
FIG. 9 is a cut-away view diagram of a portion of a layered organic memory device in accordance with an aspect of the present invention.

Referring now to FIG. 9, an exemplary layered memory is depicted with a cutaway view of a single cell memory device that can be stacked and/or arranged with other similarly adapted memory stacks (not shown) in accordance with an aspect of the present invention. The memory device 900 can include various dielectric layers such as a layer 914 and layer 916, wherein such layers are also referred to as an Inter Layer Dielectric (ILD). Such layers 914 and 916 can be semiconductor material, for example, and/or substantially any type material having dielectric properties. Within layer 916, a lower electrode 920 is formed having, an associated barrier layer 924 that mitigates diffusion of the lower electrode 920 into a subsequent layer 928. Above the lower electrode 920, a passive layer 930 is formed. The lower electrode 920 and associated passive layer (or layers) 930 cooperate as a common activation or access element for the memory device 900 described herein.

After the passive layer 930 has been formed, the dielectric layer 914 is added above the layer 916, wherein organic semiconductor material 934 (e.g., conductive polymer) is then formed within the layer 914. A conductive electrode 944 is formed over the organic semiconductor material 934 (barrier layers between the top electrode and the organic semiconductor material can be included), whereby a memory cell is formed in vertical portions (Y+ and Y− directions) of the organic material 934. Thus, if a suitable voltage is applied between electrode 944 and electrode 920, a storage state (e.g., 1, 0, other impedance state) can be stored in (or read from) the memory cell formed in the organic material 934.

A plurality of such memory devices 900 can be manufactured in accordance with an Integrated Circuit (IC) memory device (e.g., 1 Mbit, 2 Mbit, 8 mbit storage cells, . . . and so forth, constructed as a non-volatile memory IC). In addition, common-word lines such as illustrated at 958 in layer 928 can be provided to store, erase, read, and write a plurality of multi-cell structures in accordance with the present invention (e.g., 8/16 byte/word erase, read, write). It is to be appreciated that the memory device 900 can be stacked in accordance with other adapted memory devices in a vertical arrangement or columns, whereby other stacks can also be similarly constructed which is described in more detail below.

The memory device 900 illustrates a damascene via approach, which is also described in more detail below with respect to FIG. 10 in order to facilitate stacking in accordance with the present invention. Alternatively, a pillared or layered approach depicted in FIG. 11 can be provided, wherein respective layers are essentially stacked or constructed from the bottom up and successively etched to form vertical memory structures or columns in accordance with the present invention. As noted above, respective partitioning components are provided to provide separation between subsequent memory devices that are stacked upon previously formed vertical structures or columns.

Figure 10:
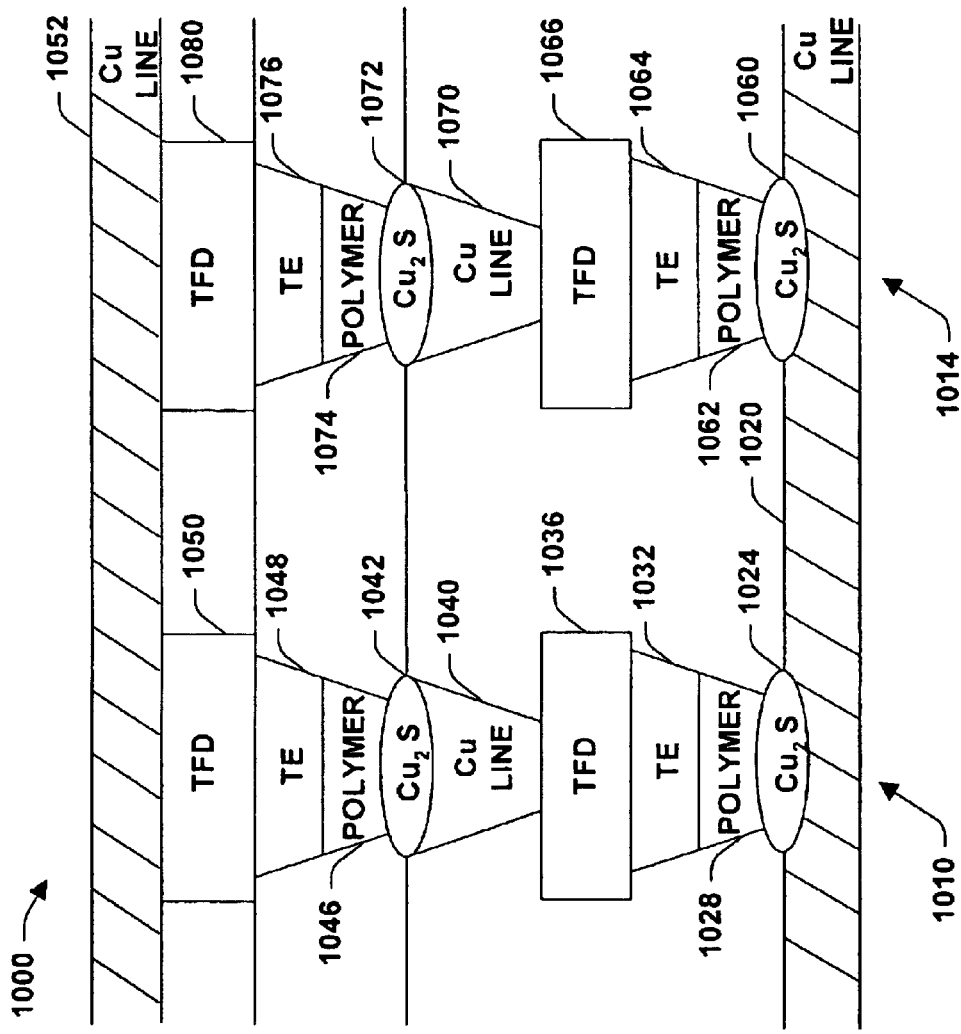
FIG. 10 is a diagram illustrating stacked memory device in accordance with an aspect of the present invention.

FIG. 10 is a diagram illustrating a stacked memory device 1000 in accordance with an aspect of the present invention. The stacked memory device 1000 depicts two vertical columns 1010 and 1014, wherein respective columns include two layers of organic memory cells. It is to be appreciated that the stacked memory device 1000 is exemplary in nature in that two columns and layers are illustrated, however, a plurality of such columns and/or layers (number of layers do not need to match number of columns) can be provided. It is further to be appreciated that alternative materials from that shown in FIG. 10 can be employed to form the stacked memory, device 1000 and are described in more detail below.

The following discussion is related to the vertical column 1010 and can be similarly applied to the vertical column 1014. Vertical column 1014 includes a copper line 1020 (e.g., global access line) having a passive $Cu_{2-x}S_y$ (where the copper is in a non-stioichiometric oxidation state: $1.8 \leq x \leq 2.0$) layer 1024 formed thereon. A self-assembling conductive polymer layer 1028 is deposited to form an organic polymer layer 1028, and then a top electrode 1032 is formed. A thin film diode 1036 (TFD) is then formed above the top electrode 1032 (TFD may be several layers as discussed above) before beginning construction of a subsequent memory layer. After the TFD 1036 is formed, another memory structure is constructed having a copper line 1040, a passive layer 1042, a polymer layer 1046 (e.g., polar polymer), and a top electrode 1048, wherein a subsequent TFD 1050 and copper layer 1052 is then formed. The vertical column at 1014 is similarly constructed from components 1060–1080.

Figure 11:
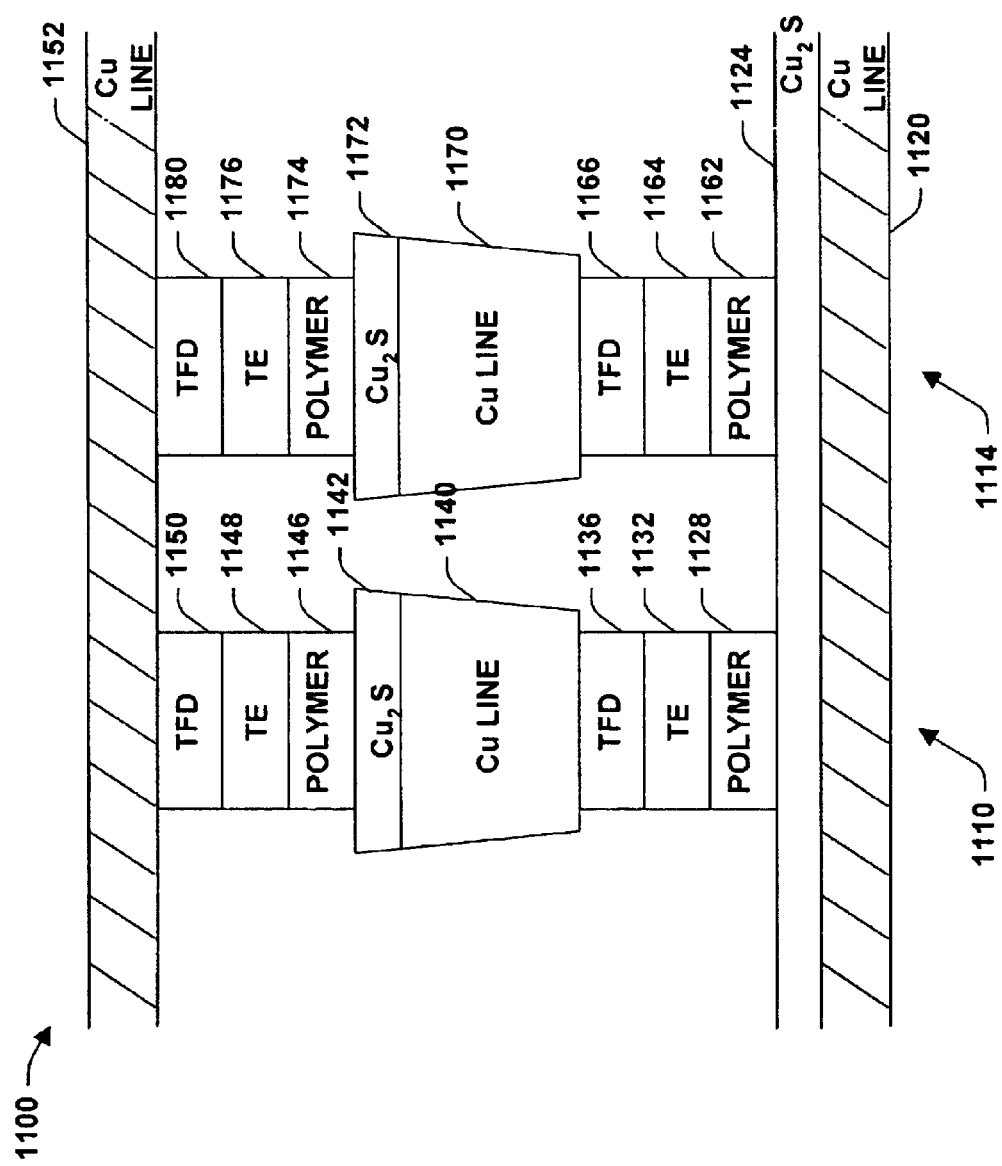
FIG. 11 illustrates a pillar approach for multi-layer memory structures in accordance with an aspect of the present invention.

FIG. 11 illustrates an alternative stacked memory device 1100 in accordance with an aspect of the present invention. Similar to the memory device 300 above, the stacked memory device 1100 depicts two vertical columns 1110 and 1114, wherein respective columns include two layers of organic memory cells. As noted above, it is to be appreciated that the stacked memory device 1100 is also exemplary in nature in that two columns and layers are illustrated, however, a plurality of such columns and/or layers (number of layers do not need to match number of columns) can be provided. It is also to be appreciated that alternative materials from that shown in FIG. 11 can be employed to form the stacked memory device 1100 and are described in more detail below.

The slacked memory device 1100 can be constructed in accordance with a pillar approach that employs constructing multiple layers then etching pillared columns from the layers and is described in more detail below with respect to FIG. 12. The following discussion is related to the vertical column 1110 and can be similarly applied to the vertical column 1114. Vertical column 1114 includes a copper line 1120 (e.g., global access line) having a passive $Cu_{2-x}S_y$ layer 1124 formed thereon. An organic semiconductor layer 1128 and a top electrode 1132 are formed above the passive layer 1124, wherein a thin film diode 1136 (TFD) is then formed above the lop electrode 1132. After the TFD 1136 is formed, another memory structure is formed having a copper line 1140, a passive layer 1142, a polymer layer 1146, and a top electrode 1148, wherein a subsequent TFD 150 and copper layer 1152 is then formed. The vertical column at 1114 is similarly constructed from components 1162–1180.

It is noted that the pillared approach illustrated by the memory device 1100 may include the formation of a plurality of layers (e.g., copper, passive, polymer, electrode, TFD, copper, passive, polymer electrode TFD . . . and so forth) before formation of vertical columns (e.g., columns 1110 and 1114) that are subsequently etched from the preceding layers. Alternatively, a subset of layers may be formed (e.g., copper, passive, polymer, electrode, TFD), wherein vertical columns are then formed in the subset, then another subset of layers are formed over the existing vertical columns, whereby other vertical columns can then be formed in the subsequent layered subset. As can be appreciated, the processes employed in accordance with the present invention can be repeated to increase memory device density.

Figure 12:
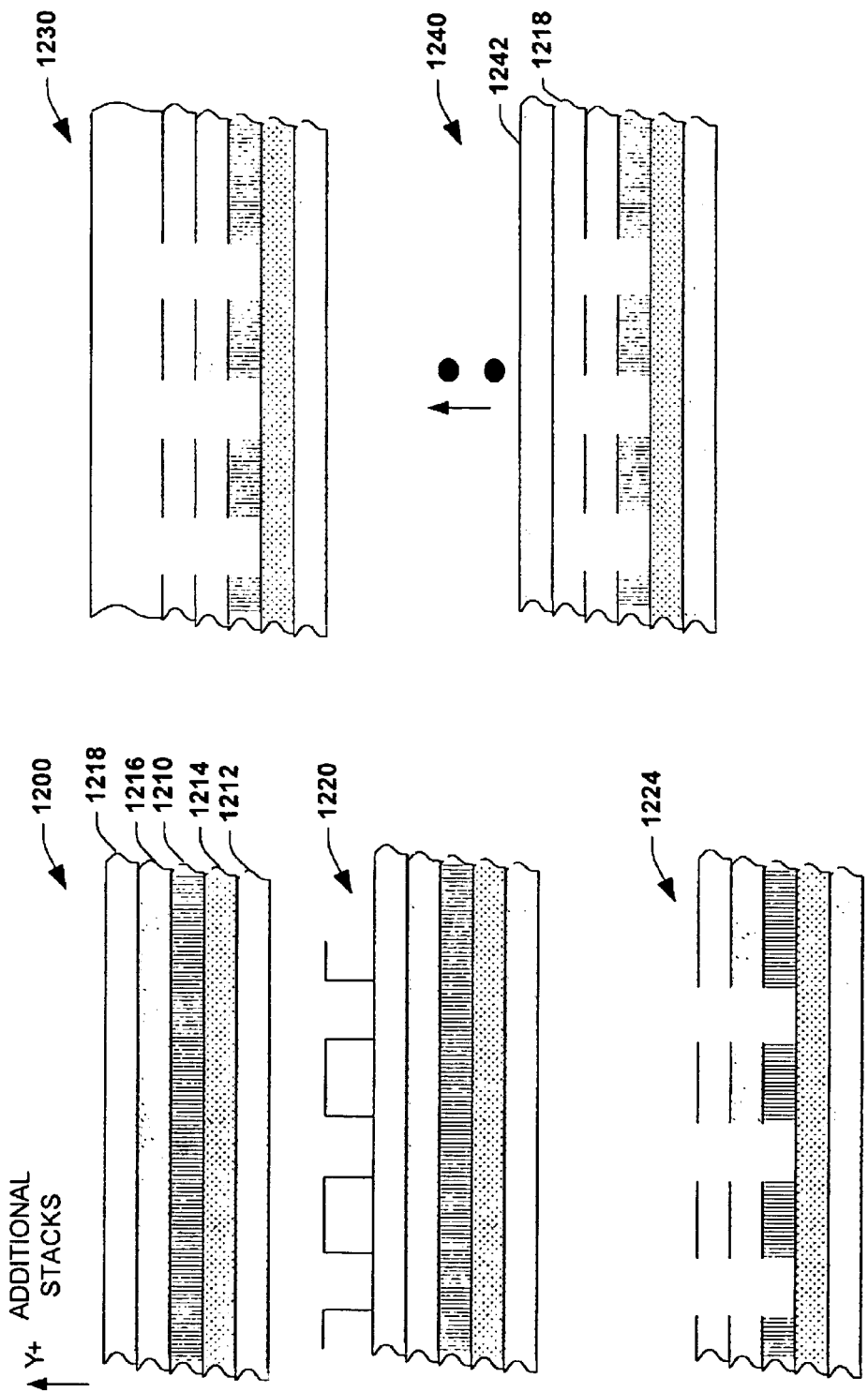
FIG. 12 illustrates a pillar approach for multi-layer memory structures in accordance with an aspect of the present invention.

FIG. 12 illustrates an alternative memory structure 1200 in accordance with an aspect of the present invention. Before proceeding with a description of the process depicted in FIG. 12, it is noted that exemplary materials and process steps will be described. However, it is to be appreciated that the present invention is not so limited. Thus, a plurality of alternative materials and/or compounds will be described in more detail below that can be employed in accordance with the present invention.

At 1200, a conducting polymer 1210 (e.g., as described above) is spun on to a copper bitline 1212 that has been exposed to $Cu_2S$ previously illustrated at 1214, the layers 1210–1214 collectively having a thickness of about 300

Å–5000 Å. A top electrode 1216 is then deposited unto the polymer 1210. A thin film diode layer(s) 1218 is then deposited on the top electrode 1216. An antireflective coating (ARC) (not shown) can also be deposited thereon to improve the reflectivity of the collective stack. It is noted that although a single stack is illustrated at 1200, that subsequent stacks can also be formed thereon—before etching of respective vertical pillars or columns are attempted. Alternatively, the stack 1200 can have vertical columns or pillars formed as described below, wherein subsequent stacks are formed and followed by subsequent etchings of vertical pillars or memory structures, and so forth.

At 1220, a resist is spun on and exposed at a suitable wavelength. The resist is then developed and the exposed part is removed. At 1224, the stack is then etched to remove the ARC (if utilized), TFD 1218, top electrode 1216, and the programmable polymer 1210 in approximately a 3 to 4 stage etch. The etch can be designed so that the resist is moved during the polymer etch. Therefore, no ash process is typically needed. If a thicker resist is needed, then the etch process can be segmented such that the ARC is etched using an $O_{2+}CHF_3$ etch. The wafer is then resist stripped utilizing a dry etch process. The etch then continues to etch the TFD, top electrode and polymer. The polymer etch can be an $O_2/N_{2+}CO$ etch and/or $N_2/H_2$ etch, for example.

At 1230, a dielectric is then deposited filling between memory cells (between respective pillars) plus the height of a via and word line (greater than sum). The dielectric may be a two-part process including a low deposition rate conformal dielectric followed by a fast deposition dielectric deposition. The deposition can be CVD or spin-on, for example. At 1240, the dielectric is planarized to the surface of the TFD 1218, wherein a word line 1242 is then formed. If desired, the above process can be repeated to produce a plurality of stacked memory cells in accordance with the present invention.

FIGS. 13–17 illustrate alternative materials and processes that may be employed in accordance with an aspect of the present invention. Accordingly, such components that have been previously described such as electrodes, conductive materials, passive layers, organic materials/layers, and processes for fabricating the same will now be described in more detail and in accordance with alternative aspects of the present invention.

Figure 13:
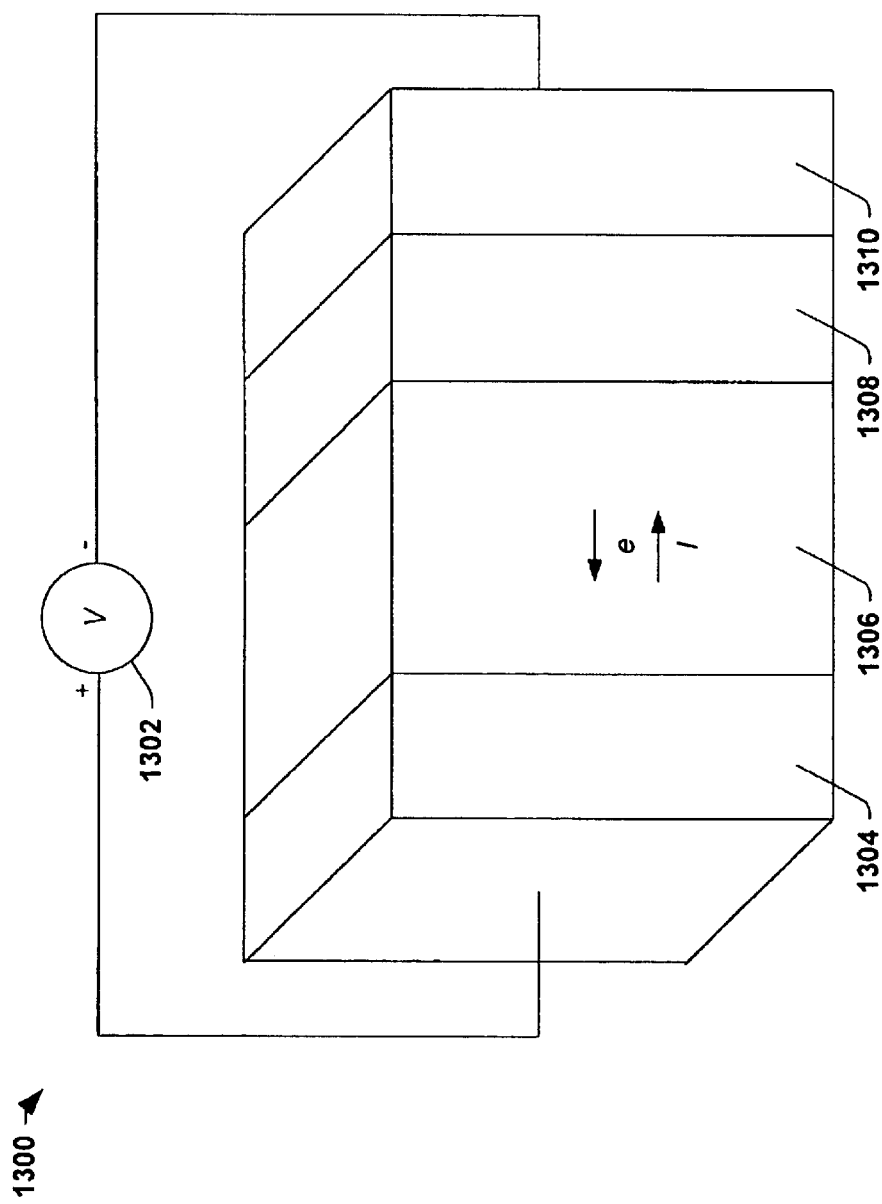
FIG. 13 is a 3-D diagram of an organic memory device in accordance with an aspect of the present invention.

Referring to FIG. 13, a 3-D diagram of an organic memory device 1300 in accordance with an aspect of the present invention is depicted. The memory device includes a first electrode 1304, a self-assembled organic semiconductor layer 1306, a passive layer 1308 and a second electrode 1310. The diagram also illustrates a voltage source 1302 connected to the first electrode 1304 and the second electrode 1310 that applies a voltage on the first electrode 1304 and the second electrode 1310. For illustrative purposes, a single first electrode is described. It is to be appreciated however that multiple electrodes having similar properties as the first electrode 1304 can be provided in a multi-cell organic memory as previously described above.

The first electrode 1304 (or multiple first electrodes) and the second electrode 1310 are comprised of a conductive material such as, copper, copper alloy, or silver alloy. Other materials can be aluminum, chromium, germanium, gold, magnesium, manganese, indium, iron, nickel, palladium, platinum, titanium, titanium nitride, tungsten, zinc, alloys thereof, indium-tin oxide, polysilicon, doped amorphous silicon, metal silicides, and the like. Exemplary alloys that can be utilized for the conductive material include copper-silver alloy, copper-zinc alloy. Other materials can be Hastelloy®, Kovar®, Invar, Monel®, Inconel®, brass, stainless steel, magnesium-silver alloy, and various other alloys.

The thickness of the first electrode 1304 and the second electrode 1310 can vary depending on the implementation and the memory device being constructed. However, some exemplary thickness ranges include about 0.01 $\mu$m or more and about 10 $\mu$m or less, about 0.05 $\mu$m or more and about 5 $\mu$m or less, and/or about 0.1 $\mu$m or more and about 1 $\mu$m or less.

The organic layer 1306 and the passive layer 1308 are collectively referred to as a selectively conductive media or selectively conductive layer. The conductive properties of this media (e.g., conductive, non-conductive, semi-conductive) can be modified in a controlled manner by applying various voltages across the media via the electrodes 1304 and 1310.

The organic layer 1306 is comprised of a conjugated organic material. If the organic layer is polymer, a polymer backbone of the conjugated organic polymer may extend lengthwise between the electrodes 1304 and 1310 (e.g., generally substantially perpendicular to the inner, facing surfaces of the electrodes 1304 and 1310). The conjugated organic molecule can be linear or branched such that the backbone retains its conjugated nature. Such conjugated molecules are characterized in that they have overlapping $\pi$ orbitals and that they can assume two or more resonant structures. The conjugated nature of the conjugated organic materials contributes to the controllably conductive properties of the selectively conductive media.

In this connection, the conjugated organic material has the ability to donate and accept charges (holes and/or electrons). Generally, the conjugated organic molecule has at least two relatively stable oxidation-reduction states. The two relatively stable states permit the conjugated organic polymer to donate and accept charges and electrically interact with the conductivity facilitating compound. The organic material may be cyclic or acyclic. For some cases, such as organic polymers, the organic material self assembles between the electrodes during formation or deposition. Examples of conjugated organic polymers include one or more of polyacetylene; polyphenylacetylene; polydiphenylacetylene; polyaniline: poly(p-phenylene vinylene); polythiophene; polyporphyrins; porphyrinic macrocycles, thiol derivatized polyporphyrins; polymetallocenes such as polyferrocenes, polyphthalocyanines; polyvinylenes; polypyrroles; and the like. Additionally, the properties of the organic material can be modified by doping with a suitable dopant for the particular polymer.

The organic layer 1306 has a suitable thickness that depends upon the chosen implementations and/or the memory device being fabricated. Some suitable exemplary ranges of thickness for the organic polymer layer 1306 are about 0.001 $\mu$m or more and about 5 $\mu$m or less, about 0.01 $\mu$m or more and about 2.5 $\mu$m or less, and about a thickness of about 0.05 $\mu$m or more and about 1 $\mu$m or less.

The organic layer 1306 can be formed via a number of suitable techniques. One suitable technique that can be utilized is a spin-on technique which involves depositing a mixture of the material and a solvent, and then removing the solvent from the substrate/electrode. Another suitable technique is chemical vapor deposition (CVD). CVD includes low pressure chemical vapor deposition (LPCVD), plasma enhanced chemical vapor deposition (PECVD), and high density chemical vapor deposition (HDCVD), It is not typically necessary to functionalize one or more ends of the organic molecule in order to attach it to an electrode/passive layer. It may have a chemical bond formed between the conjugated organic polymer and the passive layer 1308.

The passive layer 1308 contains at least one conductivity facilitating compound that contributes to the controllably conductive properties of the selectively conductive media. The conductivity facilitating compound has the ability to donate and accept charges (holes and/or electrons). Generally, the conductivity facilitating compound has at least two relatively stable oxidation-reduction states. The two relatively stable states permit the conductivity facilitating compound to donate and accept charges and electrically interact with the organic layer 1306. The particular conductivity facilitating compound employed is selected so that the two relatively stable states match with the two relatively stable states of the conjugated organic molecule of the layer 1306.

The passive layer 1308 can in some instances act as a catalyst when forming the organic layer 1306. In this connection, the backbone of the conjugated organic molecule may initially form adjacent the passive layer 1308, and grow or assemble away and substantially perpendicular to the passive layer surface. As a result, the backbones of the conjugated organic molecule may be self-aligned in a direction that traverses the two electrodes.

Examples of conductivity facilitating compounds that may make up the passive layer 1308 include one or more of copper sulfide ($Cu_{2-x}S_y$, CuS), copper oxide (CuO, $Cu_2O$), manganese oxide ($MnO_2$), titanium dioxide ($TiO_2$), indium oxide ($I_3O_4$), silver sulfide ($Ag_{2-x}S_2$, AgS), silver-copper-sulfide complex ($Ag_yCu_{2-x}S_2$), $Ag_xSb_yS_z$, $Ag_{xA}S_ySb_z$, cerium sulfate ($Ce(SO_4)_2$), ammonium persulfate (($NH_4)_2S_2O_8$), iron oxide ($Fe_3O_4$), lithium complexes ($Li_xTiS_2$, $Li_xTiSe_2$, $Li_xNbSe_3$, $Li_xNb_3Se_3$), palladium hydride ($H_xPd$) (where x and y are selected to produce desired properties), and the like. The passive layer 1308 may be grown using oxidation techniques, formed via gas phase reactions, or deposited between the electrodes.

The passive layer 1308 has a suitable thickness that can vary based on the implementation and/or memory device being fabricated. Some examples of suitable thicknesses for the passive layer 1308 are as follows: a thickness of about 2 angstroms or more and about 0.1 $\mu$m or less, a thickness of about 10 angstroms or more and about 0.01 $\mu$m or less, and a thickness of about 50 angstroms or more and about 0.005 $\mu$m or less.

In order to facilitate operation of the organic memory device, the organic layer 1306 is generally thicker than the passive layer 1308. In one aspect, the thickness of the organic layer is from about 0.1 about 500 times greater than the thickness of the passive layer. It is appreciated that other suitable ratios can be employed in accordance with the present invention.

The organic memory device, like conventional memory devices, can have two states, a conductive (low impedance or "on") state or non-conductive (high impedance or "off") state. However, unlike conventional memory devices, the organic memory device is able to have/maintain a plurality of states, in contrast to a conventional memory device that is limited to two states (e.g., off or on). The organic memory device can employ varying degrees of conductivity to identify additional states. For example, the organic memory device can have a low impedance state, such as a very highly conductive state (very low impedance state), a highly conductive state (low impedance state), a conductive state (medium level impedance state), and a nonconductive state (high impedance state) thereby enabling the storage of multiple bits of information in a single organic memory cell (e.g., n bits of information providing $2^n$ states, where n is an integer equal to or greater than 2).

During typical device operation, electrons flow from the second electrode 1310 through the selectively conductive media to the first electrode 1304 based on a voltage applied to the electrodes by the voltage source 1302 if the organic layer is n-type conductor. Alternately, holes flow from the first electrode 1304 to second electrode 1310 if the organic layer 1306 is p-type conductor, or both electrons and holes flow in the organic layer if it can be both n and p type with proper energy band match with 1308 and 1310. As such, current flows from the first electrode 1304 to the second electrode 13101 via the selectively conductive media.

Switching the organic memory device to a particular state is referred to as programming or writing. Programming is accomplished by applying a particular voltage (e.g., 0.9 volts, 0.2 volts, 0.1 volts . . . ) across the selectively conductive media via the electrodes 1304 and 1310. The particular voltage, also referred to as a threshold voltage, varies according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute the organic memory device, the thickness of the various layers, and the like. The voltage supply 1302 is controllably employed to apply the threshold voltage in this aspect of the invention. However, other aspects of the invention can utilize other means to apply threshold voltages.

Generally speaking, the presence of an external stimuli such as an applied electric field that exceeds a threshold value ("on" state) permits an applied voltage to write, read, or erase information into/from the organic memory cell; whereas the absence of the external stimuli that exceeds a threshold value ("off" state) prevents an applied voltage to write or erase information into/from the organic memory cell.

To read information from the organic memory device, a voltage or electric field (e.g., 1 volts, 0.5 volts, 0.1 volts) is applied via the voltage source 1302. Then, an impedance measurement is performed which, therein determines which operating state the memory device is in (e.g., high impedance, very low impedance, low impedance, medium impedance, and the like). As stated supra, the impedance relates to, for example, "on" (e.g., 1) or "off" (e.g., 0) for a dual state device or to "00", "01", "10", or "11" for a quad state device. It is appreciated that other number of state can provide other binary interpretations. To erase information written into the organic memory device, a negative voltage or a polarity opposite the polarity of the writing signal that exceeds a threshold value is applied.

FIG. 14 is a block diagram that depicts fabrication of a passive layer 1400 in accordance with an aspect of the present invention. A $Cu_{2-x}S_y$ layer is formed by a gas phase reaction operation. A first layer 1406 is formed that comprises Cu. A second layer 1404 is formed on the first layer. The second layer comprises $Cu_{2-x}S_y$ (e.g., $Cu_2$-$xS_y$, CuS or mixture thereof) and has a thickness of about 20 Å or more. A third layer 1402 is formed on the second layer 1404. The third layer 1402 contains $Cu_2O$. and/or CuO and generally has a thickness of about 10 Å or less. It is appreciated that alternate aspects of the invention can employ suitable variations in composition and thickness and still be in accordance with the present invention.

FIG. 15 is a block diagram illustrating an organic layer 1500 formed by a chemical vapor deposition (CVD) process in accordance with an aspect of the present invention. The organic layer 1500 is formed via a gas phase reaction process. Typically, the organic layer 1500 is formed in contact with a passive layer and an electrode. The organic layer 1500 is comprised of polymer polydiphenylacetylene (DPA). This polymer layer, as shown in FIG. 14, is fabricated to be about 65–135 Å thick.

Figure 17:
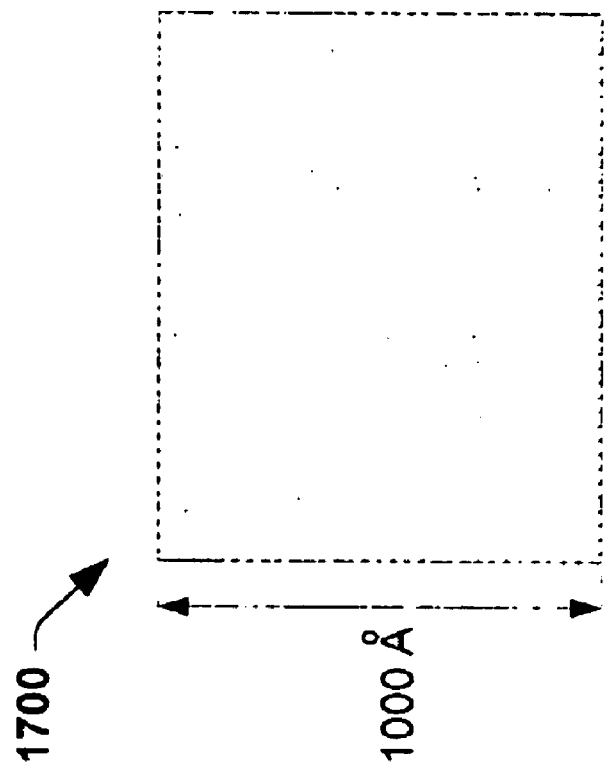
FIG. 17 is a block diagram of yet another organic polymer layer formed by a CVD process in accordance with an aspect of the present invention.
Figure 16:
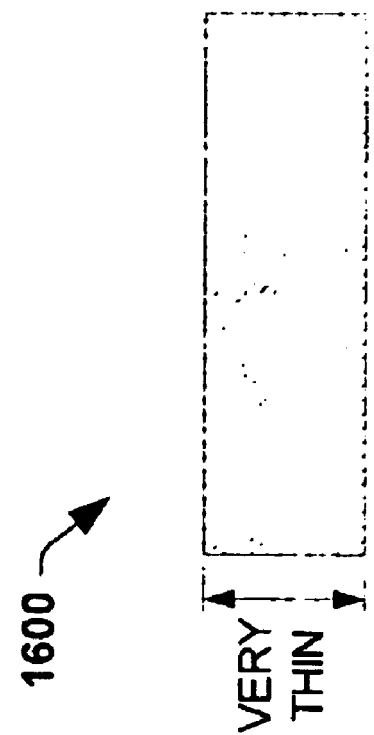
FIG. 16 is a block diagram illustrating another organic polymer layer formed by a CVD process in accordance with an aspect of the present invention.

Turning now to FIG. 16, a block diagram depicting another organic layer 1600 formed from a CVD process in accordance with an aspect of the present invention is illustrated. Once again, the organic layer 1600 is formed via a gas phase reaction process. The organic layer 1600 is formed in contact with a passive layer and an electrode. The organic polymer layer 1600 is comprised of polymer polyphenylacetylene (PPA). Referring to FIG. 17, a block diagram of another organic layer 1700 formed by spin coating, in accordance with an aspect of the present invention is illustrated. The organic layer 1700 is formed via a spin coating process, instead of a gas phase reaction process. The organic layer 1700 is formed in contact with a passive layer and an electrode. The organic layer 1700 is comprised substantially of PPA and has a thickness of about 1000 Å. It is appreciated that various alternatives to and variations of the layers described in FIGS. 14–17 can be employed in accordance with the present invention.

What have been described above are one or more aspects of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A method of processing an organic memory device, comprising:

forming a channel in a semiconductor substrate material;

forming an electrode in the channel;

mixing a polymer solution comprising a conductive polymer and an organic solvent, the polymer comprising a polar group at one end and a non-polar, conjugated chain, and depositing the polymer solution into the channel to form an organic semiconductor layer over the electrode, the polymer orienting itself so that the polar group is proximate the electrode and the non-polar chain extending away from the electrode.

2. The method of claim 1, further comprising mixing the polymer solution with a conductive polymer concentration to facilitate spinning the solution into the channel.

3. The method of claim 2, further comprising heating the polymer solution to increase the conductive polymer present in the polymer solution to a suitable concentration to facilitate self-assembly of the conductive polymer on an electrode.

4. The method of claim 1, further comprising placing the polymer solution in a vacuum to facilitate removal of the organic solvent.

5. The method of claim 1, the organic semiconductor material comprising at least one from the group consisting of polyacetylene, polyphenylacetylene, polydiphenylacetylene, polyaniline, poly(p-phenylene vinylene), polyihiophene, polyporphyrins, porphyrinic macrocycles, thiol derivatized polyporphyrins, polymetallocenes, polyferrocenes, polyphthalocyanines, polyvinylenes and polypyrroles.

6. The method of claim 1, wherein the electrode is formed in accordance with a damascene process.

7. The method of claim 1, wherein the electrode is formed in accordance with at least one of a single damascene process and a dual damascene process.

8. The method of claim 1, wherein the electrode comprises copper.

\* \* \* \* \*